(12) United States Patent
Yumoto et al.

(10) Patent No.: US 10,438,585 B2
(45) Date of Patent: Oct. 8, 2019

(54) VOICE RECORDING DEVICE AND VOICE RECORDING CONTROL METHOD

(71) Applicant: Olympus Corporation, Hachioji-shi, Tokyo (JP)

(72) Inventors: Kenta Yumoto, Hachioji (JP); Takafumi Onishi, Chofu (JP); Kazushi Fujitani, Sagamihara (JP); Ryusuke Hamakawa, Sagamihara (JP)

(73) Assignee: Olympus Corporation, Tokyo (JP)

(*) Notice: Subject to any disclaimer, the term of this patent is extended or adjusted under 35 U.S.C. 154(b) by 172 days.

(21) Appl. No.: 15/582,673

(22) Filed: Apr. 29, 2017

(65) Prior Publication Data

US 2017/0330562 A1 Nov. 16, 2017

(30) Foreign Application Priority Data

May 16, 2016 (JP) ................. 2016-097925

(51) Int. Cl.
| | |
|---|---|
| *G10L 19/00* | (2013.01) |
| *G10L 15/22* | (2006.01) |
| *G06F 3/0481* | (2013.01) |
| *G06F 3/16* | (2006.01) |
| *G10L 15/26* | (2006.01) |
| *G11B 20/10* | (2006.01) |
| *G10L 15/30* | (2013.01) |
| *G11C 7/16* | (2006.01) |

(52) U.S. Cl.
CPC .......... *G10L 15/22* (2013.01); *G06F 3/04817* (2013.01); *G06F 3/167* (2013.01); *G10L 15/26* (2013.01); *G10L 15/265* (2013.01); *G10L 15/30* (2013.01); *G11B 20/10527* (2013.01); *G10L 2015/223* (2013.01); *G11B 2020/10546* (2013.01); *G11C 7/16* (2013.01)

(58) Field of Classification Search
CPC ........................................................ G10L 19/00
USPC ............. 704/500, 235, 236, 256.1, 9; 705/3;
715/771, 810
See application file for complete search history.

(56) References Cited

U.S. PATENT DOCUMENTS

| | | | | |
|---|---|---|---|---|
| 5,913,192 A | * | 6/1999 | Parthasarathy | ......... G10L 17/24 704/244 |
| 8,265,930 B1 | * | 9/2012 | Jones | ................... G06Q 10/107 379/88.01 |
| 8,321,241 B1 | * | 11/2012 | Mansour | ................ G06Q 10/10 705/3 |

(Continued)

FOREIGN PATENT DOCUMENTS

JP 2010-049663 3/2010

OTHER PUBLICATIONS

Extended Search Report to corresponding European Patent Application No. 17168999.5, dated Oct. 24, 2017 (8 pgs.).

*Primary Examiner* — Michael C Colucci
(74) *Attorney, Agent, or Firm* — John C. Pokotylo; Pokotylo Patent Services

(57) ABSTRACT

A voice recording device that connects/is connected to a network, comprising a voice recording circuit that acquires voice and records the acquired voice as a voice file, a transmission circuit that transmits the voice file to a network, and a control circuit, the control circuit including an information extraction section that extracts associated information that has been associated with the voice file, and a display that displays the associated information associated with a voice data file.

11 Claims, 10 Drawing Sheets

(56) References Cited

U.S. PATENT DOCUMENTS

| | | | | |
|---|---|---|---|---|
| 9,804,768 | B1* | 10/2017 | Heilbrunn | G06F 3/0488 |
| 2002/0091548 | A1* | 7/2002 | Auer | G06F 19/3418 |
| | | | | 705/3 |
| 2004/0073458 | A1* | 4/2004 | Jensen | G06Q 10/10 |
| | | | | 705/2 |
| 2004/0204938 | A1 | 10/2004 | Wolfe et al. | |
| 2004/0204941 | A1 | 10/2004 | Israch et al. | |
| 2004/0216058 | A1* | 10/2004 | Chavers | G06F 3/0481 |
| | | | | 715/810 |
| 2008/0065412 | A1* | 3/2008 | Vallone | A61B 5/00 |
| | | | | 705/2 |
| 2008/0243548 | A1* | 10/2008 | Cafer | G06F 3/04817 |
| | | | | 705/3 |
| 2009/0125329 | A1* | 5/2009 | Kuo | G06Q 10/10 |
| | | | | 705/3 |
| 2012/0004902 | A1* | 1/2012 | Sorkey | G16H 10/60 |
| | | | | 704/9 |
| 2013/0326386 | A1* | 12/2013 | Vendrell | G06F 19/321 |
| | | | | 715/771 |
| 2014/0330563 | A1* | 11/2014 | Faians | G06Q 30/0185 |
| | | | | 704/236 |
| 2014/0350966 | A1* | 11/2014 | Khatana | G16H 10/60 |
| | | | | 705/3 |
| 2014/0358586 | A1* | 12/2014 | Patel | A61B 34/10 |
| | | | | 705/3 |
| 2016/0026761 | A1* | 1/2016 | Gulaka | G06F 19/321 |
| | | | | 715/771 |
| 2016/0314246 | A1* | 10/2016 | Roberge | G06F 19/321 |
| 2018/0301222 | A1* | 10/2018 | Dew, Sr. | G06Q 50/24 |

* cited by examiner

FIG. 5

TIME: 12/14/13:00

| FILE NAME | USER ID | TYPIST ID | PATIENT ID | PATIENT GENDER | PATIENT AGE | AFFECTED AREA | PRIORITY LEVEL | CONDITION | ESTIMATED COMPLETION | DEADLINE | START TIME | FORECAST |
|---|---|---|---|---|---|---|---|---|---|---|---|---|
| 100020.wma | 1000 | 01300 | 00243 | MALE | 65 | HEART | HIGH | COMPLETED | 12/13/15:00 | 12/14/15:00 | 12/13/10:00 | COMPLETED |
| 100021.wma | 1000 | 02000 | 01002 | FEMALE | 48 | LUNGS | MEDIUM | IN PROGRESS | 12/14/17:00 | 12/15/10:00 | 12/14/11:30 | ○ |
| 100022.wma | 1000 | 01300 | 00540 | FEMALE | 15 | LIVER | LOW | NOT STARTED | 12/14/16:00 | 12/14/17:00 | — | ▲ |
| 100023.wma | 1000 | 02000 | 00376 | MALE | 5 | KIDNEY | MEDIUM | NOT STARTED | 12/15/10:00 | 12/15/12:00 | — | ○ |
| 100024.wma | 1000 | 02000 | 00420 | FEMALE | 30 | KIDNEY | LOW | NOT STARTED (DELAYED) | 12/15/10:00 | 12/13/12:00 | — | × |
| 100025.wma | 1000 | 02200 | 00603 | FEMALE | 53 | NECK | MEDIUM | IN PROGRESS | 12/15/10:00 | 12/16/11:00 | 12/14/11:00 | ○ |
| 100026.wma | 1000 | 02000 | 00750 | MALE | 52 | URINARY | MEDIUM | NOT STARTED | 12/14/17:00 | 12/15/08:00 | — | ▲ |
| 101003.wma | 1001 | 01300 | 00450 | MALE | 28 | BRAIN | HIGH | HIGH | COMPLETED | 12/13/15:00 | 12/13/11:00 | COMPLETED |

FIG. 9

|  | COMPLETED | IN PROGRESS | NOT STARTED | ... |
|---|---|---|---|---|
| TASK CONDITIONS | (dashed) | (thin) | (thick) | ... |
| TASK FORECAST | ○ | ▲ | × | ... |
|  | (light) | (striped) | (dark) | ... |
| AFFECTED AREA | HEART | STOMACH | LUNGS | ... |
|  | ♡ | stomach icon | lungs icon | ... |
| FEMALE | 0–5 YEARS OLD | 6–50 YEARS OLD | OVER 50 YEARS OLD | ... |
|  | baby F icon | woman icon | elderly woman icon | ... |
| MALE | 0–5 YEARS OLD | 6–50 YEARS OLD | OVER 50 YEARS OLD | ... |
|  | baby M icon | man icon | elderly man icon | ... |
| ⋮ | ⋮ | ⋮ | ⋮ | ⋱ |

VOICE RECORDING DEVICE AND VOICE RECORDING CONTROL METHOD

Benefit is claimed, under 35 U.S.C. § 119, to the filing date of prior Japanese Patent Application No. 2016-097925 filed on May 16, 2016. This application is expressly incorporated herein by reference. The scope of the present invention is not limited to any requirements of the specific embodiments described in the application.

BACKGROUND OF THE INVENTION

1. Field of the Invention

The present invention relates to a voice control device and voice recording control method capable of communication with a network together with processing of voice data.

2. Description of the Related Art

Conventionally, for example, so-called transcription (dictation) has been carried out in corporations, hospitals or the like, whereby a user records voice data using a voice recording device such as an IC recorder, this voice data file is played back by a typist, and the played back content is typed into a document while listening to the play back.

With a networked transcription system, it is possible upload voice data files that have been recorded with a voice recording device to a server device on a network. A typist's (transcriptionist's) PC (personal computer) is connected to this network, and transmission of voice data files to the typist is carried out by selecting a voice data file that has been uploaded to the server device and downloading to this PC. The typist plays back the voice data file that has been downloaded to their own PC, and creates text data using a text creation application such a word processor (called "transcription").

An operation management system capable of unified management by instructing a task deadline to a typist and correlating task conditions, typist information, voice filename etc. when requesting this type of transcription, has been proposed (refer to Japanese patent laid-open No. 2010-49663 (hereafter referred to as "patent publication 1")).

Also, recent voice recording devices have a wireless function such as WiFi installed, and are also capable of uploading voice data files with task commands to a server device. As a result, it becomes possible to transfer voice data from a voice recording device to a PC, and it is possible to carry out task condition confirmation and task requests from a PC via the network. If this type of method is used, then even in an environment where a PC can not be used (such as, when a physician carries out recording for a clinical examination using a voice recording device, such as when doing the rounds within a hospital or at the time of a clinical examination outside a hospital), for example, task condition confirmation and issuing task commands become possible.

SUMMARY OF THE INVENTION

A voice recording device of a first aspect of the present invention, that connects/is connected to a network, comprising: a voice recording circuit that acquires voice and records the acquired voice as a voice file; a transmission circuit that transmits the voice file to a network; a control circuit, the control circuit including an information extraction section that extracts associated information that is associated with the voice file, and a display that displays the associated information associated with a voice data file.

A voice recording control method of a second aspect of the present invention, for a voice recording device that is capable of connection to a network comprising: acquiring voice and recording as a voice file, transmitting the voice file to a network, extracting associated information that has been associated with the voice file, and displaying the associated information in correlation with a voice data file.

BRIEF DESCRIPTION OF THE DRAWINGS

FIG. 5 is a drawing showing a database stored in a server device of one embodiment of the present invention.

FIG. 9 is a drawing showing icon data for display of icons in the voice recording device of one embodiment of the present invention.

DETAILED DESCRIPTION OF THE PREFERRED EMBODIMENTS

Figure 1:
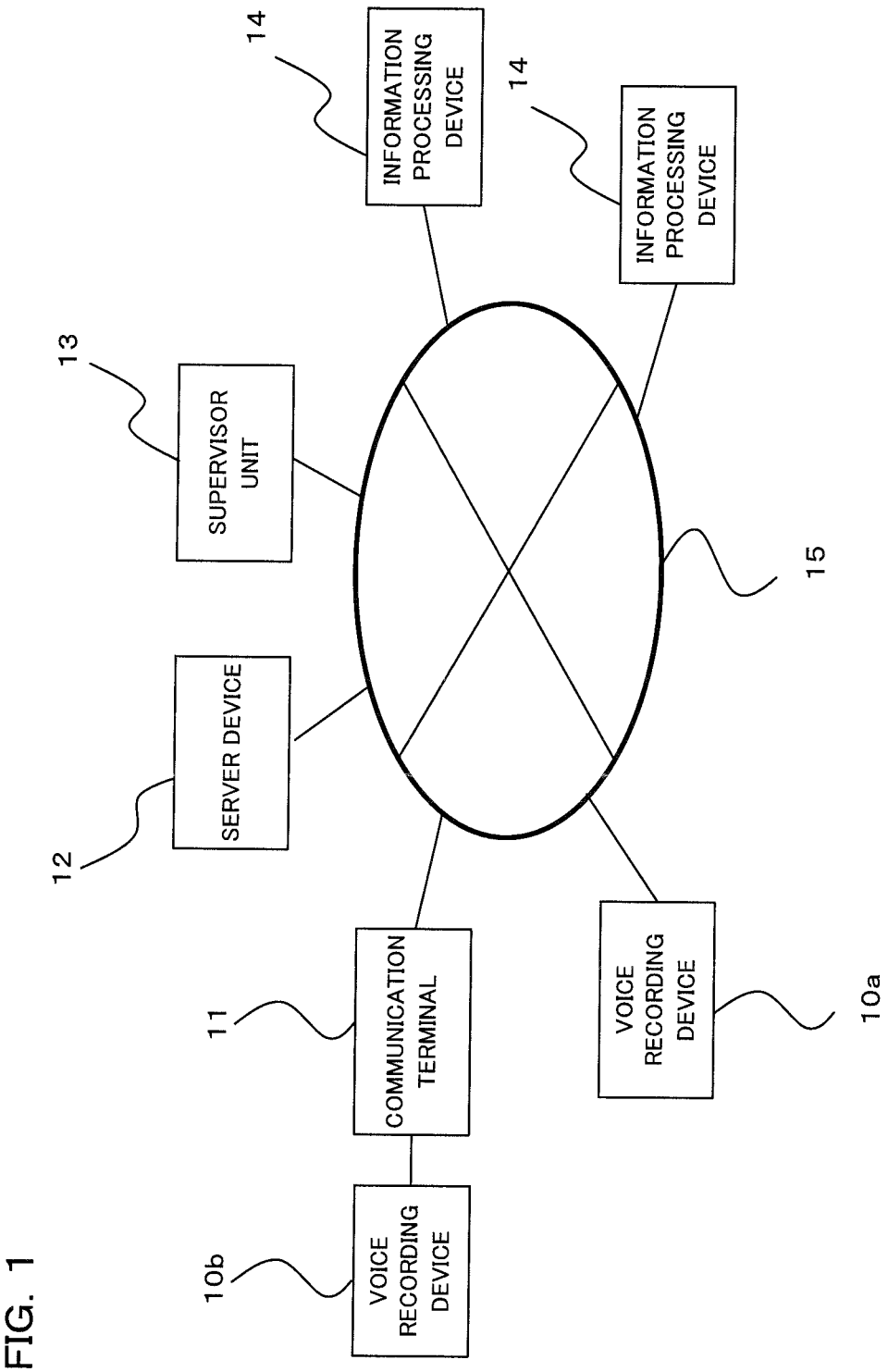
FIG. 1 is a block diagram showing the whole of an information communication system of one embodiment of the present invention.

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

A voice recording device of one embodiment of the present invention, and an information communication system including this voice recording device, will be described in the following with reference to the attached drawings. The voice recording device of this embodiment, and the information communication system, will be described using as an example a case where a doctor records clinical examination information of a patient into a voice IC recorder, and requests a typist who is connected on a network to perform a medical transcription task on a voice data file to create an electronic medical chart.

First, the overall structure of the information communication system of this embodiment will be described using FIG. 1. This information communication system comprises voice recording devices 10a and 10b, a communication terminal 11, server device 12, supervisor unit 13, information processing unit 14 and network 15.

The voice recording devices 10a and 10b are, for example, voice IC recorders for recording voice, and are provided with a communication function for connecting to the network 15. The voice recording device 10a is provided with a communication function, and can connect directly to the network 15 using wireless communication such as WiFi or Bluetooth (Registered Trademark). Also, the voice recording device 10b can carry out communication with the communication terminal 11 using wireless communication such as Bluetooth (Registered Trademark). The voice recording device 10b is capable of connecting to the network 15 by means of a network connection function of the communication terminal 11.

For example, if the communication terminal 11 is a smartphone that is capable of tethering connection, the voice recording device 10b can connect to the network 15 by means of a telephone circuit of the smartphone. In this case, connection to the network 15, task condition confirmation and task commands become possible, even if the doctor is at a location outside a hospital that is not a connection spot for wireless communication. Detailed structure of the voice recording devices 10 (when the voice recording devices 10 and 10b are described collectively, they will be abbreviated to voice recording devices 10) will be described later using FIG. 2.

The server device 12 is configured capable of communication with each unit via the network 15. The server device 12 receives a voice data file and task information (level of priority, task deadline) that have been transmitted from the voice recording devices 10 and communication terminal 11, as well as receiving documents and typist task conditions (progress, expected completion date, task start date, task completion date) that have been transmitted from the information processing unit 14. The server device 12 carries out creation of a management database by associating the received voice data file, user, typist, patient information etc. The management database will be described later using FIG. 5.

The supervisor unit 13 is a PC operated by an administrator, and is capable of connection to other devices via the network 15. Via the network 15, the supervisor unit 13 reads out administration information from a management database that has been created by the server device 12, and provides this information to another server device, which is not illustrated. Also, in a case where the supervisor unit 13 has received change in administration information (for example, task priority level, task deadline etc.) from another server device supply of change etc. to administration information to another server device is carried out. An administrator ascertains priority level and task conditions for a transcription task, and task request conditions for independent typist tasks (for example, degree of congestion) based on information of the management database, and transmits a task request via the supervisor unit 13 to an appropriate typist.

It should be noted that with the example shown in FIG. 1, description has been given of a configuration where the management database is managed by a plurality of server devices. However, the present invention is not limited to this and it is also possible to carry out unified management of a management database for each business or each hospital on a client server, for example. It is also possible to have a configuration where the supervisor unit 13 is not provided, and a management database is automatically created and administered based on various information transmitted from the voice recording devices 10 and 10b, communication terminal 11 and information processing unit 14 in accordance with a program built-in to the server device 12 (client server). Task requests to a typist may also be direct requests by users by means of the voice recording devices 10.

The information processing unit 14 is a PC used by a typist, and is capable of connection to the network 15. The information processing unit 14 receives a task request as a result of an administrator issuing a command via the supervisor unit 13, and receives a voice data file relating to this task request, together with task information (task deadline, level of priority etc.), from the server device 12. A typist plays back the voice data file using the information processing unit 14, and carries out a transcription task. After transcription has been completed, the text is transmitted to the voice recording devices 10 and/or the server device 12 as an electronic medical chart file. Also, the information processing unit 14 transmits task information such as time of receipt, task start time, estimated completion time, etc. for the task request that has been received by the typist, to the server device 12.

Figure 2:
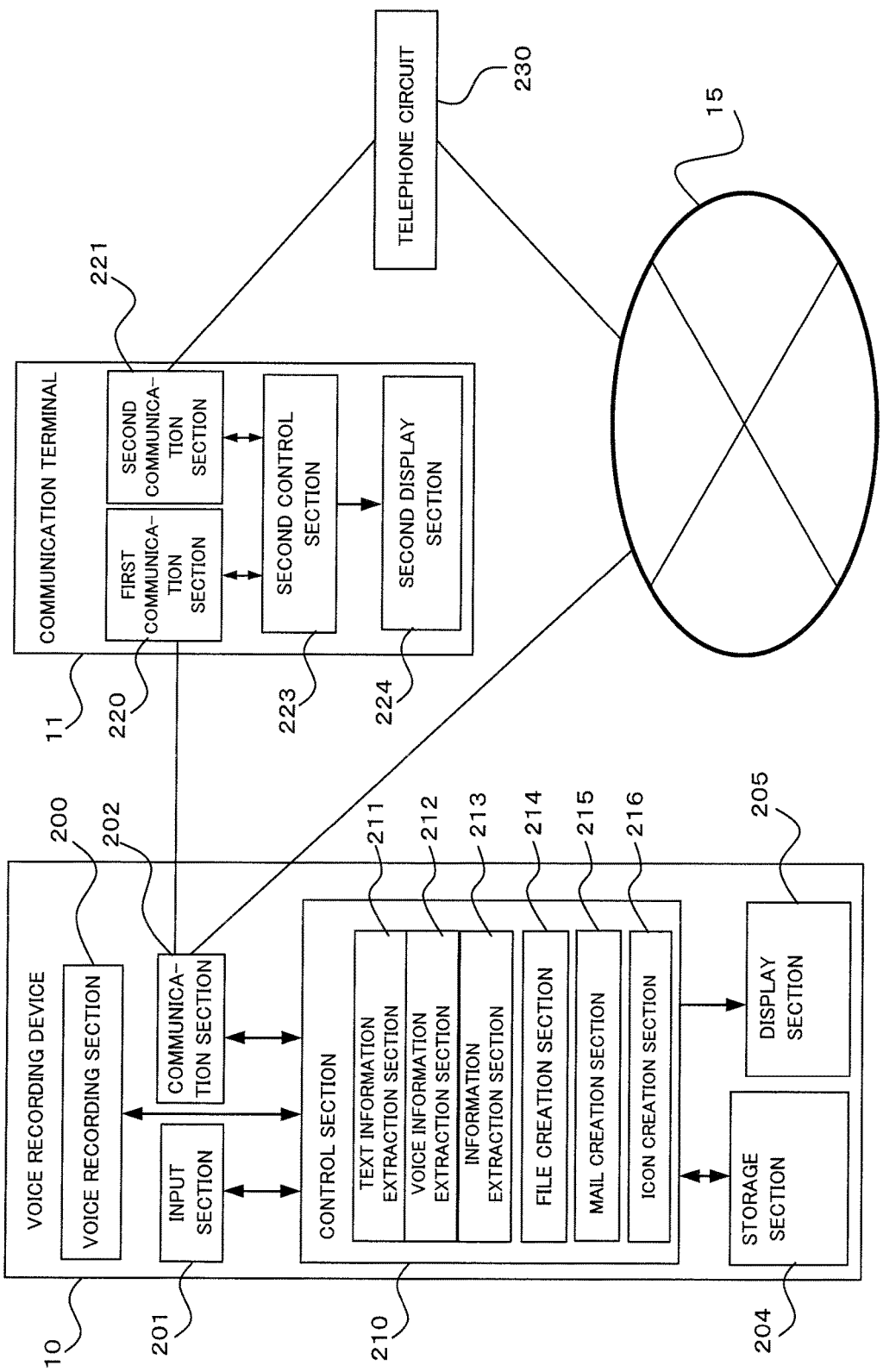
FIG. 2 is a block diagram showing the structure of a voice recording device and a communication terminal etc. within an information communication system of one embodiment of the present invention.

Next, the voice recording devices 10 and the communication terminal 11 will be described using FIG. 2. The voice recording devices 10 have a voice recording section 200, an input section 201, a communication section 202, a control section 210, a storage section 204 and a display section 205.

The voice recording section 200 includes a microphone for converting voice that has been spoken by a user into an electrical signal, and a voice signal processing circuit for carrying out various processing such as amplification processing and AD conversion processing of a voice signal that has been converted. The voice recording section 200 also includes a memory that temporarily stores voice data that has been subjected to AD conversion processing. This voice data is stored in the storage section 204 after having been converted to a voice data file by a file creation section 214 within the control section 210. The voice recording section 200 functions as a voice storage circuit for acquiring voice and storing as a voice file.

The input section 201 has operation members, such as buttons for the user to input various operations, and a touch panel or the like located on the display section. Detection results of the operation members and the touch panel are output to the control section 210. The input section 201 functions as an interface that receives input expected by the user of the voice recording device. It is possible to set what information within the administration information creation of an icon is based on, in accordance with input from this interface.

The communication section 202 has a transmission circuit and a reception circuit, etc., connects to the network 15 and the communication terminal 11 using a wireless connection method such as Wi-Fi or Bluetooth (registered trademark), and carries out transmission and reception of data. It should be noted that the communication section 202 of the voice recording device 10a in FIG. 1 is capable of direct connection to the network 15, and the communication section 202 of the voice recording device 10b is capable of connection to the network 15 via the communication terminal 11 and a telephone circuit 230. The communication section 202 may be capable of connection to both the communication terminal 11 and the network 15, or may be capable of connection to only one of them.

The communication section 202 functions as a transmission circuit that transmits a voice file to the network. Also, the communication section 202 functions as a receiving circuit that receives administration information that has been associated with a voice file by an information processing device other than a voice recording device that has been connected to the network (not limited to the information processing unit 14 and also including the server device server device 12 and supervisor unit 13 etc.).

The control section 210 has a CPU (Central Processing Unit), CPU peripheral circuits and a memory etc., and governs overall control of the voice recording devices in accordance with a program that has been stored in memory. A character information extraction section 211, voice information extraction section 212, information extraction section 213, file creation section 214, mail creation section 215, and icon creation section 216 are provided within the control section 210, and each of these sections is implemented using software or hardware, such as the CPU within the control section 210 and the CPU peripheral circuits.

The file creation section 214 creates a voice data file based on voice data that has been converted to a digital signal by the voice recording section 200. The mail creation section 215 creates a mail file when the user transmits a request for a transcription task to an information device 14 (operator terminal) together with the voice data file.

The character information extraction section 211 extracts information used in icon creation from text information that has been created as a result of a transcription task for each voice data file. The text information extraction section 211 functions as a text information extraction section that extracts character information associated with the voice data file, from text that has been created by the transcription task.

The voice information extraction section 212 extracts information used in icon creation from voice information that the user has spoken for each voice data file. Voice data that has been converted by the voice recording section 200 is stored within the storage section 204 or the voice recording section 200, and so information necessary for icon creation is extracted using this voice data. The voice information extraction section 212 functions as a voice information extraction section that extracts voice information associated with a voice file from the voice file, by analyzing the voice file.

The information extraction section 213 extracts information necessary for icon creation from information that has been extracted by the character information extraction section 211, information that has been extracted by the voice information extraction section 212, and information from a management database (refer to FIG. 5) in which the information is associated with voice data, which will be described later. Information necessary for icon creation will be described later (refer to FIG. 8A-FIG. 8C, and FIG. 9).

The information extraction section 213 functions as an information extraction section that extracts associated information that is associated with the voice file. This information extraction section extracts associated information from administration information (information stored in the management database). The information extraction section also extracts associated information from voice information. In this embodiment, administration information is administration information related to a transcription task relating to a voice data file. The information extraction section extracts associated information from text information.

With this embodiment, associated information is information relating to a transcription task for a voice file, and includes information of at least one of task deadline, task progress conditions, priority level and the person in charge of the transcription task (refer to FIG. 5). Also, when associated information is information relating to a medical transcription task relating to a voice data file, information relating to the medical transcription task includes at least one of age, gender, affected area and medical condition of a patient.

The icon creation section 216 creates icons based on information relating to each of the voice data that have been extracted by the information extraction section 213. The icon creation section 216 functions as an icon creation section that creates icons that are associated voice data files based on associated information.

The storage section 204 stores email address of operator terminals that become necessary when transmitting operation requests to the information processing unit 14, each of the voice data files, and administration information of the voice data files, that has been extracted by the information extraction section 213, in association with the voice data files. It should be noted that the administration information will be described later using FIG. 5.

The display section 205 displays operation information during operations such as voice recording time and time of a task request, and icons relating to each voice data file. Icon display examples will be described later using FIG. 8A-FIG. 8C and FIG. 9. The display section 205 functions as a display that displays associated information correlated to a voice data file. The display displays icons that have been correlated to voice data files based on the associated information.

The communication terminal 11 is capable of connection to the network 15 using a telephone circuit 230, and it is possible to use, for example, a smartphone. The communication terminal 11 is provided with a first communication section 220, a second communication section 221, a second control section 223 and a second display section 224.

The first communication section 220 has a communication circuit and connects to the voice recording devices 10 using a wireless communication method such as WiFi, Bluetooth (registered trademark), or NFC (near-field communication), to carry out communication of data. The second communication section 221 has a communication circuit and connects to the network 15 using the telephone circuit 230. The second communication section 221 functions as a communication circuit that connects to a network.

The second control section 223 has a CPU (Central Processing Unit), CPU peripheral circuits and a memory etc., and carries out overall control of the communication terminal 11 in accordance with a program that has been stored in memory. The second control section 223 functions as a second control circuit. The second display section 224 displays operation information during various operations, and displays icons that have been received from the voice recording devices 10. It should be noted, with regard to icon display, that the text information extraction section, voice information extraction section, information extraction section, and icon creation section 216 may be provided within the second control section 223, and icons generated and displayed using the second control section 223.

Figure 3:
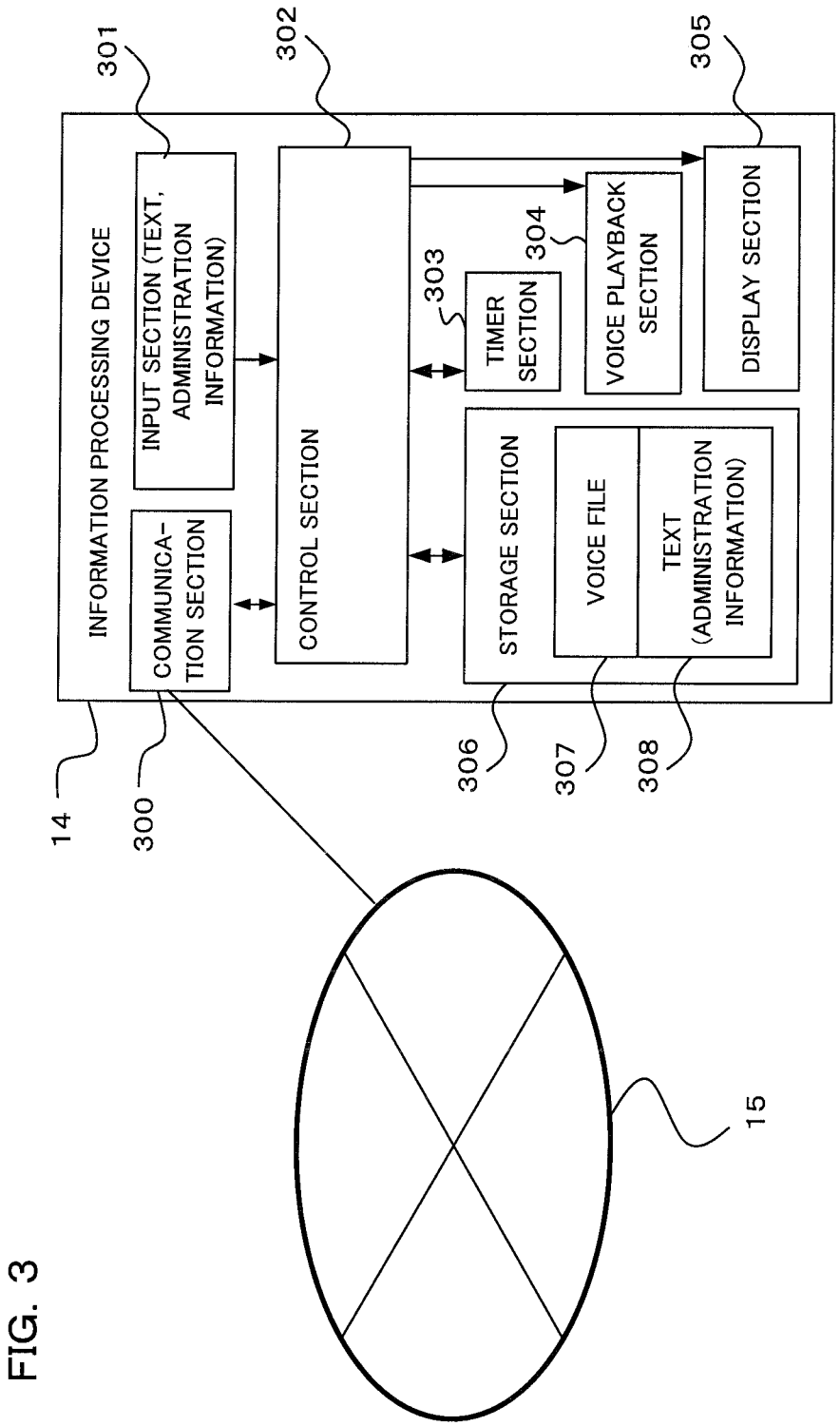
FIG. 3 is a block diagram showing the structure of an information processing device within an information communication system of one embodiment of the present invention.

Next the structure of the information processing unit 14 will be described using FIG. 3. This information processing unit 14 reproduces voice data that has been acquired and generated by the voice recording devices 10, and is used by a typist when carrying out a transcription task. The information processing unit 14 is a PC, for example, and has a communication section 300, an input section 301, control section 302, storage section 306, timer section 303, voice playback section 304, and display section 305.

The communication section 300 carries out communication with the voice recording devices 10 and the supervisor unit 13, communication terminal 11, and server device 12 via the network 15, and receives voice data files and task requests relating to these voice data files (email document, task deadline, level of priority) etc. Task deadline is a desired task completion date that has been set by the user (for example, a doctor). The test deadline may be a deadline date that has been set automatically by the server device 12 or the supervisor unit 13 based on administration information that will be described later.

Level of priority is a task priority level that has been set by the user. Task priority level being made administration information is because there are cases where, when the same typist receives a plurality of task requests, priority level is appended and it is more convenient for a user to be able to set which voice data file they want to subject to transcription first. Priority level may also be set automatically by the supervisor unit 13 or the server device 12 based on administration information that will be described later.

The input section 301 includes a mouse and a keyboard etc. that are required in order for a typist to operate the information processing device. A typist carries out a transcription task while looking at display on the display section 305 and listening to voice resulting from playback of a voice data file by the voice playback section 304. The typist creates an electronic medical chart once the transcription task is complete, and transmits the electronic medical chart to the server device 12 via the communication section 300. In the event that the destination server device 12 is not the most appropriate server device (for example, a server managed by a hospital to which the doctor originating the task request belongs), the information processing unit 14 may retransmit to the most appropriate server device. At the same time as transmission to the server device 12, the electronic medical charts may also be transmitted to the voice recording devices 10 and communication terminal 11 where the task request originated. Also, the typist transmits task information (task progress conditions and estimated completion time) to the server device 12, and to the voice recording devices 10 and communication terminal 11, separately from the electronic medical chart.

The control section 302 has a CPU (Central Processing Unit), CPU peripheral circuits and a memory etc., and carries out control of all of the various operations of the information processing unit 14 in accordance with a program that has been stored in memory. With this embodiment the control section 302 carries out processing to manage information associated with a task request, such as a voice data file, email receipt and etc. for every item in a task request. Also, the control section 302 carries out processing to manage an electronic medical chart and task information that have been created using the input section 301 for each of these task items, and carries out processing to display on the display section and processing to transmit to the server device 12 etc. in accordance with typist operations.

Together with keeping track of the current time, the timer section 303 keeps track of task request receipt times and task commencement or completion times, and transmits these items of time information to the control section 302. The control section 302 carries out processing to manage task administration information by storing times at which a task is commenced or completed for every task item.

The voice playback section 304 has a voice processing circuit for converting voice data to an analog voice signal, and a speaker etc., and reproduces a voice data file that has been received. The display section 305 displays various operation screens. With this embodiment administration information is displayed on the display section 305 for every task request item, and using this display it is possible for the typist to confirm information on items being requested. Operation screens of document creation software for typing and operation screens of voice data file reproduction software are also displayed on the display section 305.

The storage section 306 stores voice data files in correlation with task administration information and text files that have been created by the typist.

Next, operation of the voice recording devices 10 of this embodiment will be described using the flowchart shown in FIG. 4. This flowchart (and the same also applies to the flowcharts shown in FIG. 6 and FIG. 7 that will be described later) is executed by the CPU within the control section 210 in accordance with a program that is stored in memory. The flow shown in FIG. 4 is mainly for operations to record voice and transmit a transcription task request.

Figure 4:
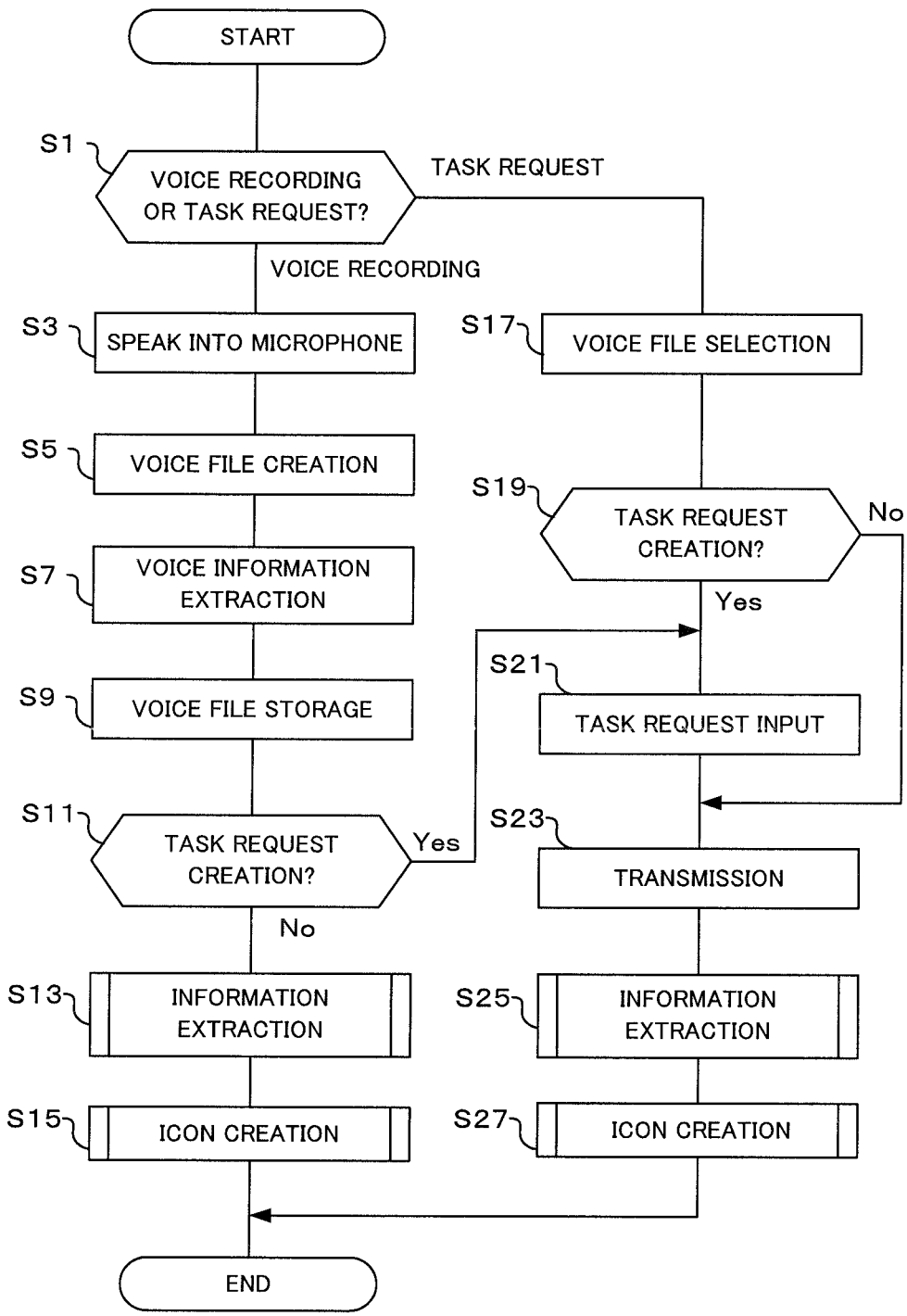
FIG. 4 is a flowchart showing main operation of the voice recording device of one embodiment of the present invention.

If the flow shown in FIG. 4 is commenced, it is first determined whether to carry out voice recording or to carry out a task request (S1). The user sets whether to carry out voice recording or to carry out a task request by operating the input section 201. In this step, therefore, determination is based on setting in the input section 201.

If the result of determination in step S1 is to carry out voice recording, the user records speech (S3). This is a case where the user has turned on a voice record button of the input section 201, and in this step the voice recording section 200 converts voice to voice data and commences recording to memory within the voice recording section 200.

Next a voice data file is created (S5). Regarding the voice data file, if the user has completed speaking in to the microphone and the voice record button is turned off, the voice recording is terminated and the file creation section 214 of the control section 210 creates a voice data file.

Once a voice data file has been created, next extraction of voice information is carried out (S7). Here, information necessary for icon creation, which will be described later, is extracted by the voice information extraction section 212 based on the voice data file that has been recorded. Specifically, for example, if it is a medical transcription, then since the user (doctor) has spoken in information such as name, gender, affected area and symptoms of the patient, these items of voice information are extracted using a speech recognition function. After a request for a transcription task, it is possible to extract these items of information from administration information that has been created by the supervisor unit 13. However, even before a request it is possible to extract information relating to the voice data file by extracting information from voice data in this way, and it is possible to carryout icon creation (refer to S15), which will be described later.

Once extraction of voice information has been carried out, next voice data file storage is carried out (S9). Here, a voice data file that was created in step S5 is stored in the storage section 204 in association with voice information that was extracted in step S7. Also, storage is not limited to voice information, and information relating to a task request may also be stored in the storage section 204 in association with the voice data file.

Once storage of the voice data file has been carried out, it is next determined whether or not creation of a task request will be carried out (S11). Here, a screen asking the user whether or not to carry out a task request relating to the voice data file is displayed on the display section 205. The user selects whether to carry out or not carry out creation of a task request by means of the input section 201.

If the result of determination in step S11 is that a task request is not carried out, information extraction is carried out (S13). Here, the information extraction section 213 extracts information required for icon creation from voice information that was extracted from the voice data. For example, in a case where name, gender, age, affected area and symptoms of the patient are extracted as voice information, gender, age and affected area are extracted from among those items of information as information for creating an icon. Types of information to be extracted may be set in initial settings according to what information is used, may be set by the user at the time of completing speech recording, and may be set automatically using information that has been extracted as voice information. It should be noted that information extraction is not limited to voice data, and extraction may be from other data such as text information. Detailed operation of this information extraction will be described later using FIG. 7.

Once information is been extracted, next an icon is created (S15). Here, an icon is created based on information that was extracted in step S13 (gender, age, affected area). For example, icons are created that depict, if gender is male, a design where a person can be distinguished from being female, if age is 10 years old a design where a person can be understood as being a child, or if affected area is the heart, a design of a heart on a design of a person. In this way, it becomes possible for the user to easily distinguish what type of patient the information is stored for, for every voice data file. Specific icons will be described later using FIG. 8A-FIG. 8C and FIG. 9.

If the result of determination in step S1 is task request, selection of a voice data file is carried out (S17). In this step, a voice data file for which a transcription task has been requested is selected from among a plurality of voice data files. Specifically, the user selects an icon of a voice data file that has been displayed on the display section 205 by operating a touch panel or a button etc.

Once selection of the voice data file has been carried out, it is next determined whether or not creation of a task request will be carried out (S19), similarly to step S11. Here, a screen asking the user whether or not to carry out a task request relating to the voice data file is displayed on the display section 205. The user selects whether to carry out or not carry out creation of a task request by means of the input section 201.

If the result of determination in step S19 is to carry out creation of a task request, or if the result of determination in step S11 is to carry out creation of a task request, input of a task request is carried out (S21). Here a task request having the content that was described earlier is input.

If the result of determination in step S19 is to not create a task request, or if a task request is input in step S21, transmission is carried out (S23). Here, the voice data file that was selected in step S17 or the voice data file that was stored in step S9 is transmitted to the communication terminal 11 via the communication section 202, or directly to the network 15, together with data relating to the task request that was created in step S21. The information processing unit 14 receives these items of data via the network 15. These items of data are also received by the supervisor unit 13 and the server device 12, besides the information processing unit 14. In this case, only the task request may be transmitted to the supervisor unit 13 and the voice data file not transmitted. It should be noted that in a case where a task request has already been created, or a task request is transmitted to a typist without being input, the task request is transmitted without task input.

Once transmission has been carried out, information extraction is performed (S25). Here, in the event that the user has input a task request, the information extraction section 213 extracts information based on the task request. The information here is, specifically, desired completion deadline and task priority level etc. Detailed operation of this information extraction will be described later using FIG. 7.

Once information has been extracted, next an icon is created (S27). Here, the icon creation section 216 creates an icon on the basis of the information that has been extracted. In a case where an icon has already been created based on the voice information, then information that has been extracted from the task request is added as required and the icon is recreated and updated. For example, it is possible to make it easier for the user to visually differentiate from other icons by changing background color of an icon in accordance with priority level, or making the icon itself flash for a task that has a relatively short deadline. Detailed operation of the icon creation will be described later using FIG. 6.

If an icon is created in step S15 or step S27, this flow is terminated.

Next, an administration information database for managing administration information will be described using FIG. 5. The supervisor unit 13, that is connected to the network 15 consolidates, collects and manages administration information for every voice data file for which a transcription task has been requested, from the voice recording devices 10, communication terminal 11, server device 12 of each hospital etc. and information processing unit 14 used by a typist, that are connected to the network 15.

As administration information there is, specifically, as shown in FIG. 5, file name of a voice data file, ID of a user (for example, a doctor) carrying out a task request for this voice data file, ID of a typist who has received a task request, and target patient ID. Here, from the viewpoint particularly of safeguarding an individual's information the patient ID is required to be encoded, an ID number or the like is assigned to each patient, and an individual's name is not identified to anyone other than a doctor.

Information such as gender, age, affected area etc. is also included in the administration information relating to the patient. These items of patient information may be extracted from voice information that has been recorded by the voice recording devices 10, and may be extracted from text information resulting from a transcription by the typist on a voice data file, which will be described later (refer to S57 in FIG. 7).

Further, priority level and task deadline that have been input by the user, and task conditions and estimated time and date of task completion and time and date of task commencement etc. that have been input by the typist are received and managed as administration information. Here, the task conditions and estimated date of completion may be automatically inferred by the information processing unit 14 from task conditions of the typist. Also, prediction as to whether a task will be completed on schedule may be automatically determined taking into consideration a number of task requests received by each typist, task conditions and deadlines etc., and, for example, if it is estimated that completion will be on schedule a task may be marked with "○", marked with "▲" if there is a possibility of delay, marked with "×" if the task is already delayed, or marked "completed" if the task is completed. The symbols ○, ▲, and × for the projections in FIG. 5 show the above described projections.

Further, although not shown in FIG. 5, various information such as date and time of a user request, recording date of a voice data file, data amount of a voice data file, user's hospital information, information on the company a typist belongs to, patient physical examination history, typist task completion time, date and time of task interruption, date and time of electronic medical chart return, etc. may also be input and managed as administration information.

With this embodiment, as described above, administration information is created for every voice data file for which a task request is issued, and data is updated as required. Also, if there is a request from the voice recording devices 10 or the server device 12 of a hospital etc. then administration information for each user (doctor) and each hospital is removed from within all of the administration information, and transmitted. Administration information for various task requests may be verified as required by the user (doctor) accessing the server device 12.

Next, detailed operation of the icon creation in steps S15 and S27 will be described using the flowchart shown in FIG. 6.

If the flow for icon creation is entered, it is first determined whether or not there is icon creation (S31). Here, it is determined whether to create an icon based on information that has been extracted in steps S13 and S25. Whether or not to create an icon may be set beforehand by the user on a screen such as menu mode or the like, and in this step an icon creation confirmation screen is displayed and the user may perform setting.

If the result of determination in step S31 is to carry out icon correction, it is determined whether or not it is new creation (S33). It is determined whether or not, after creating a voice data file, an icon corresponding to this voice data file was created. Here determination is based on whether or not an icon that has been correlated to the voice data file is stored in the voice storage section 204.

If the result of determination in step S33 is that icon creation is new, an icon is created (S35). Here an icon is created based on information that has been extracted. Icons to be created will be described later using FIG. 8A-FIG. 8C and FIG. 9. On the other hand, if the result of determination in step S33 is that an icon is not new, updating of an icon is carried out (S37). In the event that information that has been extracted is additional or updated, update of an icon is carried out in accordance with content of the addition or update. If there is no addition or update, update is not carried out.

If icon creation has been carried out in step S35, or if icon update has been carried out in step S37, next display of the icon is carried out (S39). Here, an icon that has been created, or an icon that has been updated, is displayed on the display section 205.

Returning to step S31, if the result of determination in this step is that an icon will not be created, information display is carried out (S41). As was described previously, in cases such as when the user has not set icon creation, display of information is carried out. Information display in this step will be described later using FIG. 10.

Once icon display has been carried out in step S39, or if information display has been carried out in step S41, the flow for icon creation is terminated and the originating flow is returned to.

Next, detailed operation of the information extraction in steps S13 and S25 will be described using the flowchart shown in FIG. 7. The flow for this information extraction extracts information that is required in icon creation.

If the flow for information extraction is entered, it is first determined whether or not administration information has been received (S51). Here, for a voice data file that is the subject of icon creation, the voice recording devices 10 determine whether or not administration information that is stored in the administration information database (refer to FIG. 5) has already been received from the supervisor unit 13.

If the result of determination in step S51 is that administration information has been received, information is extracted from the administration information (S53). Here information that is required in creating an icon shown in FIG. 8A-FIG. 8C and FIG. 9 is extracted.

Next, it is determined whether or not the information is sufficient (S55). Here it is determined whether or not it is possible to create an icon with the information that has been extracted from the administration information.

If the result of determination in step S55 is that information is not sufficient, information is extracted from text information (S57). Here, the character information extraction section 211 extracts information that is lacking using character recognition, based on text data that has been subjected to transcription. As was described previously, the typist performs a transcription task using the information processing unit 14, and the text data created here is stored in the server device 12. In this step, therefore, information is extracted based on the text data that has been stored in the server device 12. It should be noted that the text data may be obtained directly from the information processing unit 14, without going via the server device 12.

If information has been extracted from the text information, next, similarly to step S55, it is determined whether or not information is sufficient (S59.) If the result of this determination is that the information is not sufficient, information is extracted from voice information (S61). Here, the voice information extraction section 212 extracts necessary information from voice information that has been recorded in the voice recording section 200. For example, in the case of administration information such as shown in FIG. 5, the user (doctor) may have recorded administration information such as user name and patient name by speaking. In this step these items of information are extracted by voice recognition.

Returning to step S51, if the result of determination in this step is that administration information has already been received, then similarly to step S61 information is extracted from voice information (S63). In a case where administration information has not been received, since transcription has also not been completed it is not possible to extract information from voice information only, and so voice information is extracted by a voice information extraction section. It should be noted that in a case where voice information has been extracted at the time of voice recording in step S7 in FIG. 4, it is not necessary to extract voice information again in this step.

If the result of determination in step S55 or step S59 is that the information is sufficient, or if information has been extracted from voice information in step 6S1 or S63, the flow for information extraction is terminated and the originating flow is returned to. If the originating flow is returned to, icon creation is carried out using the results of information extraction (refer to S15 and S27 in FIG. 5).

Figure 6:
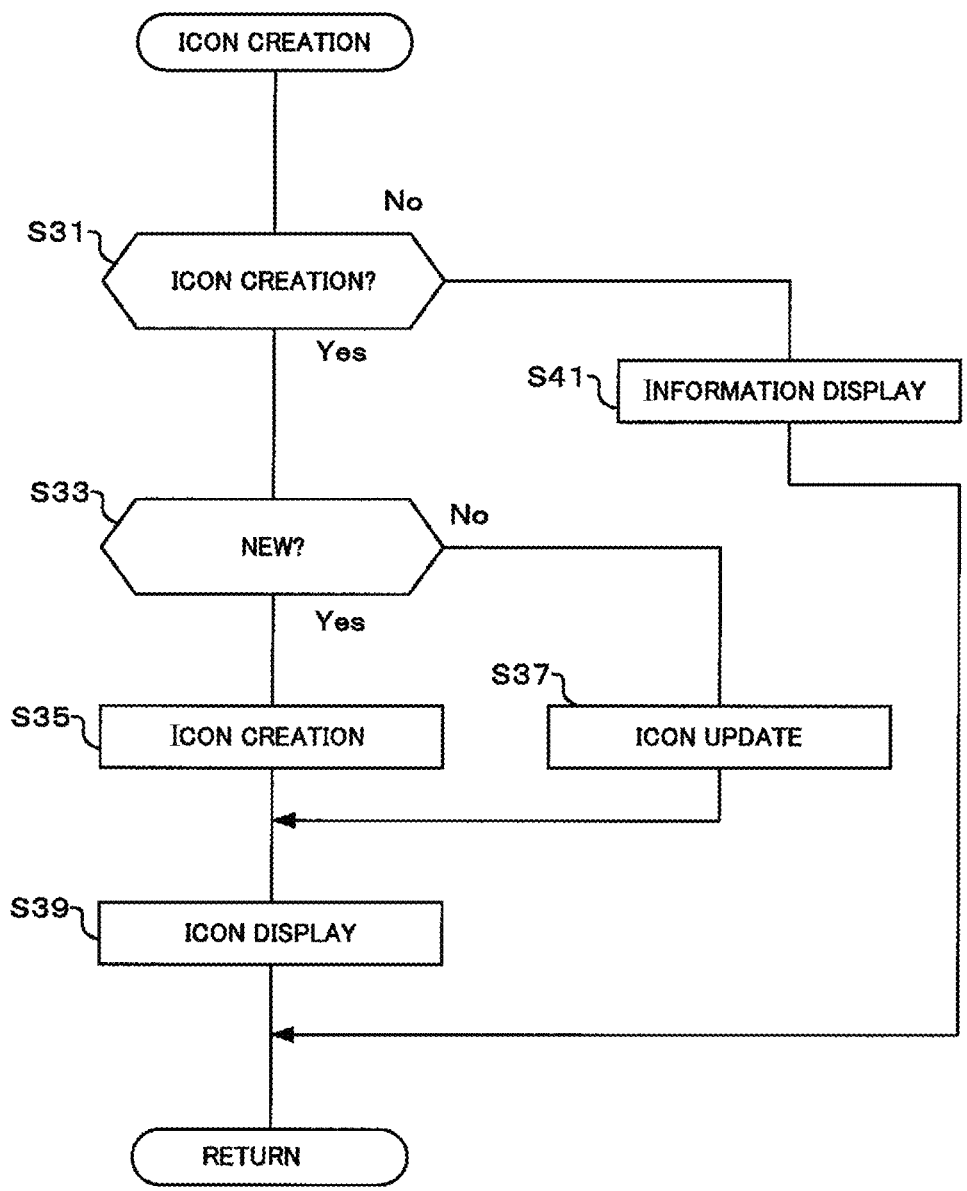
FIG. 6 is a flowchart showing an icon creation operation of the voice recording device of one embodiment of the present invention.

In this way, in the flowcharts of this embodiment there are a voice recording step of acquiring voice and recording as a voice file (refer to S3 and S5 in FIG. 4), a transmission step of transmitting the voice file to a network (S23 in FIG. 4), an information extraction step of extracting associated information that has been correlated with the voice file (S13 and S25 in FIG. 4, and FIG. 7), and a display step of displaying associated information in association with the voice data file (S15 and S27 in FIG. 4, and S39 in FIG. 6). As a result it is possible to display associated information for each voice file, and it becomes easy to grasp the overall situation at a glance.

Figure 7:
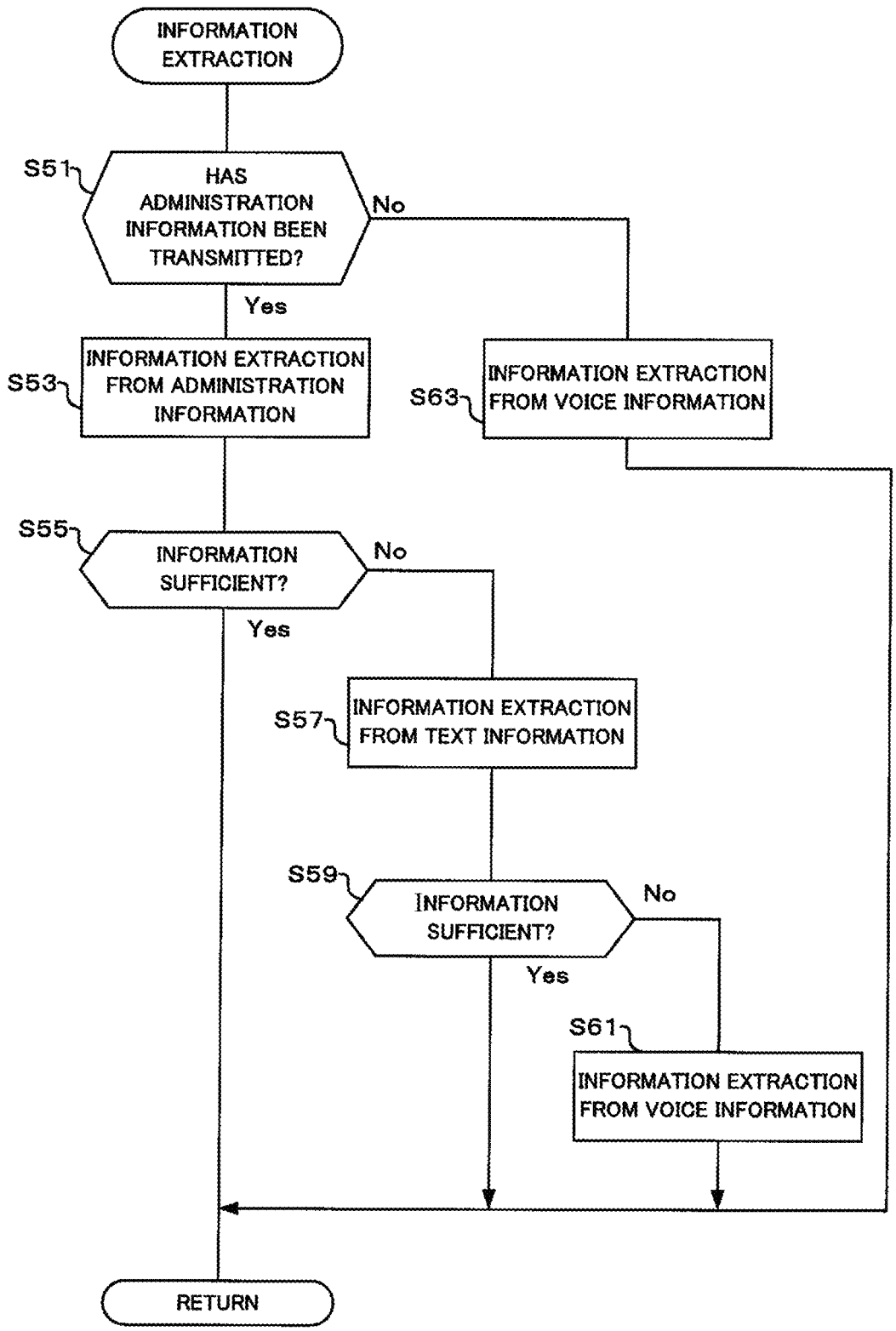
FIG. 7 is a flowchart showing an information extraction operation of the voice recording device of one embodiment of the present invention.

Also, in a case where administration information has been received, the associated information is first of all extracted from the administration information (S53 in FIG. 7), is then extracted from text information if the information is not sufficient (S57 in FIG. 7), and, if the information is still not sufficient, is then extracted from voice information (S61 in FIG. 7). Specifically, administration information that includes information from an information processing device is extracted with priority, then text information from the information processing device. As a result it is possible to extract the full amount of information efficiently and quickly.

In creation of an icon, in a case where information that has been extracted has been added or updated, updating of the icon is carried out (S33 and S37 in FIG. 6). As a result it is possible to display the newest information. In a case where a transcription is being requested based on voice that has been recorded by the voice recording devices 10, it is possible to display various newest information, such as the transcription request, confirmation of state of progress, estimated delivery date, etc.

It should be noted that in FIG. 7 description has been given for a sequence for extracting information from text information after administration information extraction, but the present invention is not limited to this sequence and it is also possible to carry out information extraction from text information before carrying out information extraction from administration information. For example, before the management database is created a text file for a transcription task that is in progress may be received directly from the information processing unit 14 of the typist, and information extracted from this text file. In this case, the character information extraction section 211 extracts information based on text data for which transcription is in progress. Also, in FIG. 7 information is carried out in the order, administration information, text information then voice information, but this is not limiting and information extraction may be in an arbitrary order, or information may be extracted from either one or from only two types of information.

Figure 8A:
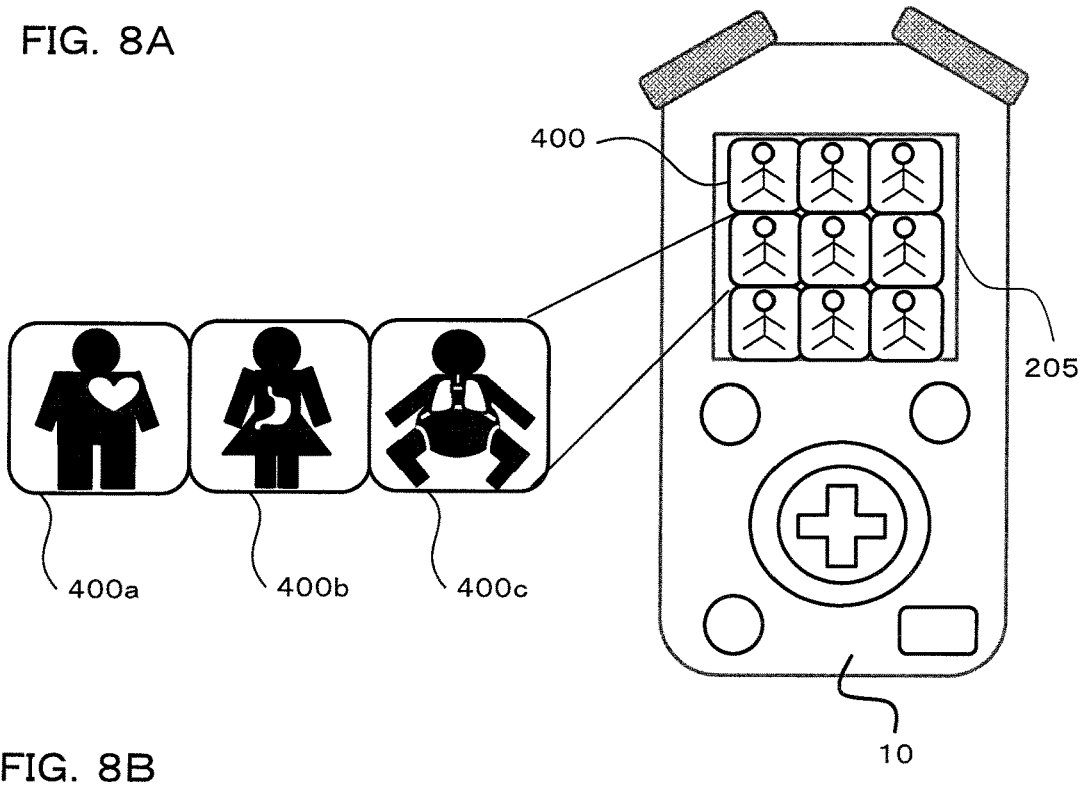
FIG. 8A-FIG. 8C are drawings showing icons of the voice recording device of one embodiment of the present invention.
Figure 8B:
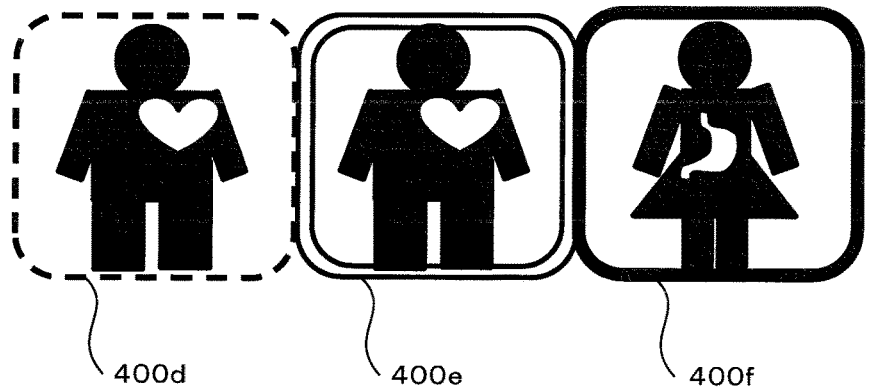

Next, examples of icons will be described using FIG. 8A-FIG. 8C. FIG. 8A shows display examples of icons 400 on the display section 205 of the voice recording devices 10. The icons 400 are displayed side by side for each voice data file, and with the example shown in FIG. 8A icons are displayed three vertically and three across, giving a total of nine icons. Each icon 400 reflects information on gender, age and affected area, in accordance with information that has been extracted, and it is known what type of patient the voice data relates to. For example, with the example shown in FIG. 8A a heart mark of icon 400*a* represents affected part information, the patient design (silhouette) of icon 400*b* represents that the patient is female, and the patient design of icon 400*c* represents that the patient is a baby.

Also, the icons 400 may represent state of progress of a transcription task. For example, as shown in FIG. 8B, icon borders may differ in accordance with state of progress. The fact that a task has been completed (transcription has been performed) is shown by making the border of the icon 400*d* a dashed line. The fact that a task is in progress is shown by giving the icon 400*e* a double-line border. The fact that a task has not yet been started is shown by making the border of the icon 400*f* a bold line.

Also, the icon 400 may make it possible to identify task completion estimate. For example, as shown in FIG. 8C, color of an icon background may differ in accordance with task completion estimate. The background color (shown thinly dotted) of the icon 400*g* indicates that it is estimated that a task will be completed before the deadline (○). The background color (shown by vertical stripes) of the icon 400*d* indicates that it is not clear whether or not the task will be completed before the deadline (▲). The background color (shown thickly dotted) of the icon 400*i* indicates that it is estimated that a task will likely not be completed before the deadline (×).

Figure 8C:
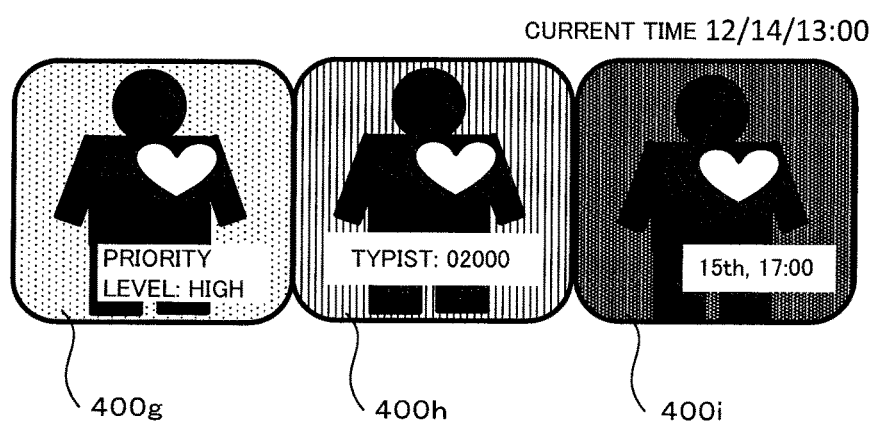

Also, the icon 400 may have estimated data and time of task completion, priority level, typist ID etc. displayed superimposed on the icon, as shown in FIG. 8C. The icon itself may be small, but sufficient visibility is made possible if fewer letters and numerals are used, such as, for example, for data and time of completion ("17:00, 12th"). Although not shown, an icon itself may be made to flash for cases where a task has not been completed by the deadline.

FIG. 9 shows an icon database. This database is stored in advance in memory, such as the storage section 204 of the voice recording devices 10. The icons 400 shown in FIG. 8A have icons (design of internal organs, icon border, icon) and backgrounds etc. selected by retrieving from the database in accordance with conditions of respective items (task condition, task forecast, affected area, gender, age), and displayed. For example, information for gender and age can be extracted, and it can be determined what person shape design will be used in an icon.

It should be noted that what information is reflected in creation of an icon may be set beforehand by the user using the input section 201, and may also be set by the control section 210 performing determination depending on the amount of information. Also, information used at the time of creating an icon may be automatically set by the control section 210 depending on size and resolution of the display section 205.

For example, in a case where the display section 205 is large and a case where resolution is high, the user can quickly see respective icons even if the amounts of information for creating the icon increased, which means that it becomes possible to more accurately grasp items. In FIG. 8C, either one of priority level, typist or deadline date are displayed, but it is also possible to display all of these items. Also, with the example shown in FIG. 8A, a design (silhouette) representing a patient has been simplified, but a more complicated design may also be created.

In this way, in situations where a plurality of voice recording devices having display sections of different sizes are used, or when a voice recording device and a communication terminal having display sections of different sizes are used, icon display that is appropriate for the size of the respective display sections becomes possible.

Figure 10:
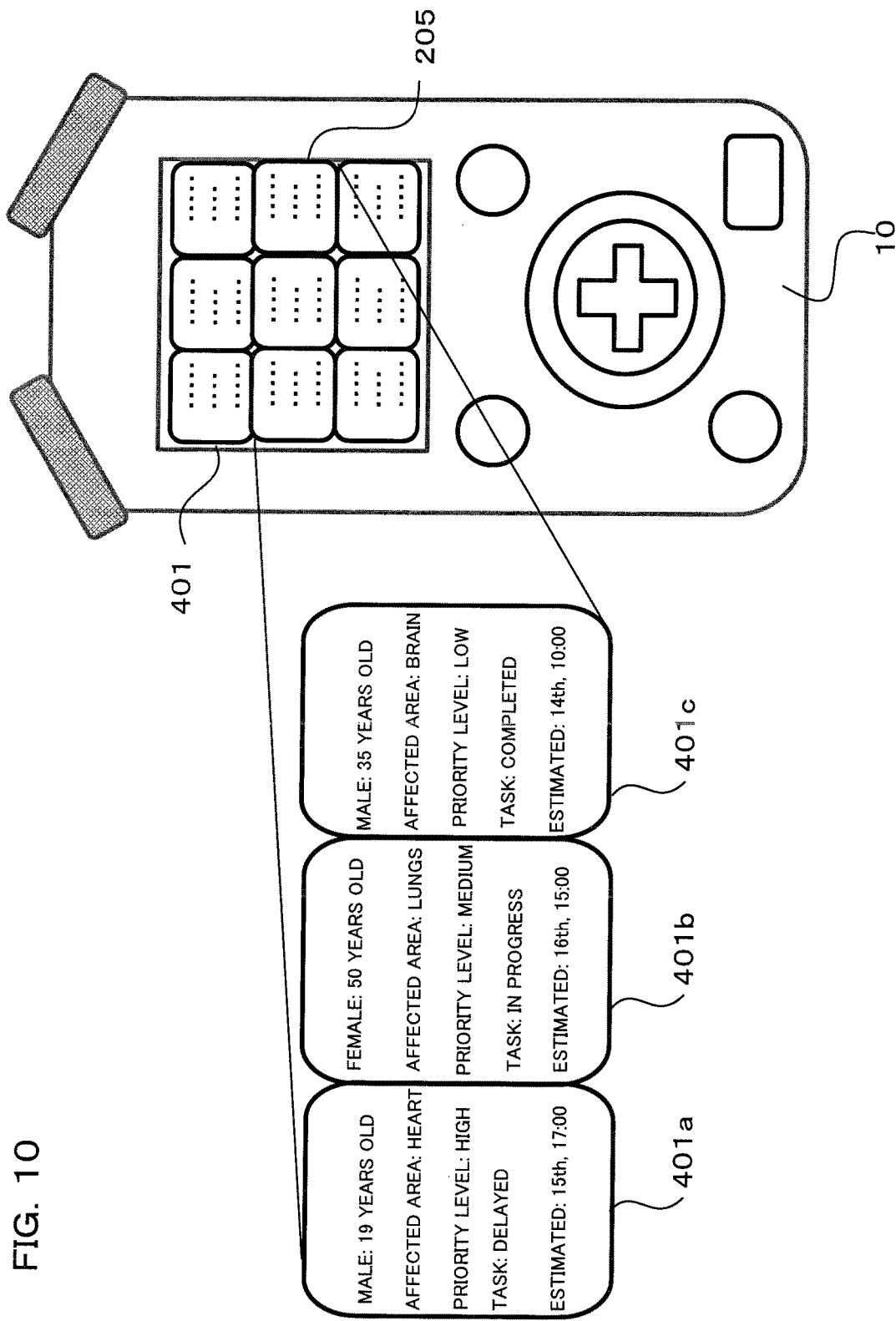
FIG. 10 is a drawing showing an example of display of items other than icons in the voice recording device of one embodiment of the present invention.

Next, an example of displaying information that is associated with voice data file using text information instead of designs (icons) will be described using FIG. 10. This information display 401 is executed in step S41 of FIG. 6. This information display may be display of only characters from task information and patient information that has been extracted, simply replacing file name. The information displays 401 are displayed side by side for every voice data file, and with the example shown in FIG. 10, items of information are displayed three vertically and three across, giving 9 items of information in total.

Each information display 401 displays information that has been extracted as characters. With this example, gender, age and affected area of the patient, priority level of a transcription task, state of progress of the task, and estimated completion date of the task, are displayed. As information, items other than these may be added, and some of the items shown in FIG. 10 may be omitted. In this way it is possible for the user to verify information associated with voice data on a small-sized display section, even if icons are not created.

In this way, in one embodiment of the present invention there are an information extraction section that extracts associated information that has been associated with a voice file, and a display section that displays associated information in correlation with a voice data file. As a result it is possible to simply verify information that has been associated with a voice file, even on a small-sized display screen. Specifically, since associated information that has been extracted by the information extraction section is displayed in correlation with a voice file, it is possible to simply verify an overall image for each voice file, even with a small-sized display screen.

Also, with one embodiment of the present invention, an icon is created based on associated information that has been extracted using an information extraction section, and this icon is displayed. As a result, by confirming an icon the user is able to intuitively get an idea of the nature of a voice file, even with a voice recording device (communication terminal) having a small display section.

Also, with one embodiment of the present invention, administration information is received via a network 15 (refer to FIG. 5), and associated information is extracted on the basis of this administration information that has been received. As a result it also becomes possible to display conditions of sections that are external to the voice recording device in correlation with a voice file.

Also, with one embodiment of the present invention, a voice file is analyzed and associated information is extracted. As a result associated information is extracted using a voice file that has been subjected to voice recording, and it is possible to carryout display of the associated information even in a case where administration information can not be acquired from external sections.

Also, with one embodiment of the present invention, deadline for a task item, state of progress, level of priority, person in charge of a task etc. are extracted as associated information, and displayed. As a result, it is possible to intuitively carry out determination of task items, verification of task progress, etc. Further, it is possible for the user (doctor) to request a task by confirming an icon, and to update a task request as required based on these items of information. For example, it is possible to confirm progress of a task and estimated completion time, and to carry out a typist update request, and level of priority update and required deadline extension etc., for every request item.

Since verification of task conditions, and task requests, that were not conventionally possible when a PC having a large screen was not used, are made possible even with a display screen of a small mobile terminal such as a voice recording device or communication terminal, and it is possible for the user to carry out a task request anywhere (for example, before doing the rounds or at the time of an examination that is outside a hospital) without having to return to a room where there is a PC. Since it is possible for the user (doctor) to transmit a task request at the point in time when they have recorded voice, it becomes possible for a typist to commence a transcription task extremely quickly. Further although conventionally a user transmits a plurality of requests together when they have returned to their desk, since task requests are transmitted spread over time, transcription tasks are handled efficiently Also, with one embodiment of the present invention, it is possible to appropriately set items that will be displayed using icons, using an input section 201. This makes it possible to efficiently display items that are required by the user.

It should be noted that with one embodiment of the present invention, description has been given for a configuration in which information extraction for icon creation, and icon creation, are carried out in a voice recording device. However, this is not limiting, and it is also possible, for example, to have a configuration where processing from information extraction up to icon creation is carried out in the communication terminal 11. In this case, the communication terminal 11 has the functions of the character information extraction section 211, voice information extraction section 212, information extraction section 213 and icon creation section 216 within the voice recording devices 10, and acquires a voice data file from the voice recording devices 10. Then, together with acquiring administration information via the network 15, icons etc. may be created for every voice data file using the voice data file etc., and display on the second display section 224 may be carried out.

Also, with one embodiment of the present invention an icon that has been created by the icon creation section 216 within the voice recording devices 10 is displayed on the display section 205. However, this is not limiting, and an icon may also be transmitted to the communication terminal 11 and the icon displayed in the communication terminal 11. Specifically, the communication terminal 11 is provided with a first communication section 220 that connects to the network 15 and a second display section 224, the voice recording device 10 connects to the network 15 via the communication terminal communication terminal 11, the communication terminal 11 receives an icon that has been created by the voice recording device, and this icon is displayed on the second display section 224.

Also, with one embodiment of the present invention, it is possible for the user to customize what type of icon will be created. For example, with the example shown in FIG. 8A it is only possible to differentiate between an adult and a baby, but it is also possible to increase the variety of icons shape so that it is possible to differentiate age in finer steps.

Also, with the one embodiment of the present invention, regarding the control section 210, second control section 223 and control section 302, some or all of the functions of each section have been implemented using a CPU (Central Processing Unit), peripheral circuits of the CPU and program code, but this is not limiting, and some or all of the sections may be implemented by circuits that are executed by program code such as a DSP (Digital Signal Processor), may use a hardware structure such as gate circuits that are generated based on a programming language described using Verilog, or may be executed using hardware circuits.

Also, with the one embodiment of the present invention the voice recording device has been described using an IC recorder as an example, but this is not limiting, and the present invention may be applied to any device that is capable of recording voice. Also, as suitable examples of the voice recording device description has been given using a transcription task for a conversation at the time of a physical examination in a hospital as an example, but this is not limiting, and the present invention can also be applied in various situations, such as recording speeches in meeting minutes, recording business meetings, and recording of manuscripts by a lawyer etc.

Also, among the technology that has been described in this specification, with respect to control that has been described mainly using flowcharts, there are many instances where setting is possible using programs, and such programs may be held in a storage medium or storage section. The manner of storing the programs in the storage medium or storage section may be to store at the time of manufacture, or by using a distributed storage medium, or they be downloaded via the Internet.

Also, regarding the operation flow in the patent claims, the specification and the drawings, for the sake of convenience description has been given using words representing sequence, such as "first" and "next", but at places where it is not particularly described, this does not mean that implementation must be in this order.

As understood by those having ordinary skill in the art, as used in this application, 'section,' 'unit,' 'component,' 'element,' 'module,' 'device,' 'member,' 'mechanism,' 'apparatus,' 'machine,' or 'system' may be implemented as circuitry, such as integrated circuits, application specific circuits ("ASICs"), field programmable logic arrays ("FPLAs"), etc., and/or software implemented on a processor, such as a microprocessor.

The present invention is not limited to these embodiments, and structural elements may be modified in actual implementation within the scope of the gist of the embodiments. It is also possible form various inventions by suitably combining the plurality structural elements disclosed in the above described embodiments. For example, it is possible to omit some of the structural elements shown in the embodiments. It is also possible to suitably combine structural elements from different embodiments.

What is claimed is:

1. A voice recording device that connects/is connected to a network, comprising:
    a voice recording circuit that acquires voice pertaining to patient information that is spoken by a user, and records the acquired voice as a respective voice file for each patient;
    a transmission circuit that transmits the voice file to a network;
    a control circuit, the control circuit including a voice information extraction section, an information extraction section and an icon creation section, wherein
       the voice information extraction section analyzes speech stored in the voice file to extract voice information associated with the voice file,
       the information extraction section that extracts associated information that is associated with the voice file from the voice information, and
       the icon creation section creates an icon that has been correlated with each voice data file, based on the associated information; and
    a display that displays the icons for each of the voice data files, each of which has been associated with a voice data file, in rows, based on the associated information.

2. The voice recording device of claim 1, further comprising:
    a receiving circuit that receives administration information, being administration information associated with a transcription task associated with the voice data file, that has been correlated to the voice file from an information processing device other than the voice recording device that has been connected to the network, wherein
    the information extraction section extracts the associated information from the administration information.

3. The voice recording device of claim 1, wherein
    the control circuit further comprises a text information extraction section that extracts text information that has been associated with the voice data file from text that has been created by a transcription task, and wherein
    the information extraction section extracts the associated information from the text information.

4. The voice recording device of claim 1, wherein
    the associated information is information relating to a transcription task relating to the voice file, and the information relating to the transcription task includes information of at least one of task deadline, task progress state, priority level information and information about the person in charge of the transcription task,
    the icon creation section creates an icon corresponding to information associated with transcription task, for each of the voice data files, and
    the control circuit displays the icon on the display.

5. The voice recording device of claim 1, wherein
    the associated information is information relating to medical transcription task relating to the voice data file, and the information relating to the medical transcription task includes at least one of age, gender, affected area and medical condition of a patient,
    the icon creation section creates an icon corresponding to information associated with transcription task, for each of the voice data files, and
    the control circuit displays the icon on the display.

6. The voice recording device of claim 1, further comprising:
    an interface that takes in input by a user of the voice recording device, wherein
    the icon creation section sets which information, within the administration information, creation of the icon will be based on, in accordance with input from the interface.

7. An information communication system having a communication terminal capable of communication with the voice recording device of claim 1, comprising:
    a communication circuit that connects to a network,
    a second control circuit, and
    a second display section, wherein
    the second control circuit
    causes the voice recording device to connect to the network via the communication terminal,
    causes the communication terminal to receive an icon that has been created by the voice recording device, and
    causes the second display section to display the icon.

8. The voice recording device of claim 1, wherein each of the icons encodes a patient gender, a patient age and an affected area of the patient's body.

9. The voice recording device of claim 1, wherein each of the icons encodes at least one of a task state and a task forecast associated with a patient's medical record.

10. A voice recording control method for a voice recording device that is capable of connection to a network, comprising:
    acquiring voice pertaining to patient information that is spoken by a user, and recording the acquired voice as a respective voice file for each patient;

analyzing the voice file from voice of the voice file, and extracting voice information associated with the voice file;

transmitting the voice file to a network;

extracting associated information that has been associated with the voice file from the voice information;

creating icons for identifying the voice data files, each of which icons being correlated with each voice data file, based on the associated information; and displaying the icons for each of the voice data files in rows, each of which icons has been correlated with the voice data file, based on the associated information.

11. A non-transitory computer-readable medium storing a processor executable code, which when executed by at least one processor, carries out a voice recording control method within a voice recording device that is capable of connection to a network and acquires voice pertaining to patient information that is spoken by a user, to record the voice that has been acquired as a respective voice file for each patient, the voice recording control method comprising:

analyzing the voice file from voice of the voice file, and extracting voice information associated with the voice file;

transmitting the voice file to a network;

extracting associated information that has been associated with the voice file from the voice information;

creating icons for identifying the voice data files, that has been correlated with each voice data file, based on the associated information; and displaying the icons for each of the voice data files in rows, each of which icons has been correlated with the voice data file, based on the associated information.

* * * * *